United States Patent [19]

Bukhman et al.

[11] Patent Number: 4,728,606

[45] Date of Patent: Mar. 1, 1988

[54] SELF-ALIGNED TRANSISTOR METHOD

[75] Inventors: Yefim Bukhman, Tempe; Carroll M. Casteel; Gary F. Witting, both of Mesa, all of Ariz.

[73] Assignee: Motorola Inc., Schaumburg, Ill.

[21] Appl. No.: 31,820

[22] Filed: Mar. 30, 1987

[51] Int. Cl.[4] .......................................... H01L 21/265
[52] U.S. Cl. ...................................... 437/33; 437/67; 437/241
[58] Field of Search ..................... 29/576 W, 578, 580, 29/576 B; 148/1.5, 187, 175, DIG. 10, DIG. 11, DIG. 50, DIG. 51; 156/643, 653, 657; 357/34, 49, 50; 427/86, 93, 94

[56] References Cited

U.S. PATENT DOCUMENTS

| | | | |
|---|---|---|---|
| 4,433,470 | 2/1984 | Kameyama et al. | 29/578 |
| 4,462,846 | 7/1984 | Varshney | 29/576 W |
| 4,538,343 | 9/1985 | Pollack | 29/578 |
| 4,580,330 | 4/1986 | Pollack et al. | 29/578 |

*Primary Examiner*—Brian E. Hearn
*Assistant Examiner*—Kevin McAndrews
*Attorney, Agent, or Firm*—Robert M. Handy

[57] ABSTRACT

A process is described for producing semiconductor devices using a single master mask which determines the lateral dimensions of certain critical device and/or device contact regions in combination with a surrounding isolation wall. Various dielectric layers and isotropic and anisotropic etching steps are utilized in combination with a series of block-out masks to permit etching of a trench in the location of the peripheral isolation wall image in the master mask which is subsequently filled with a dielectric-semiconductor combination. For the case of a vertical bipolar transistor, a base region is implanted using an oversize selector mask. Successive block-out masks are then used to select the particular openings in the master mask which will form the base contact, the emitter and emitter contact and the collector contact. No precision alignments are required between the master mask and the selector or block-out masks. The described method is well suited to the production of transistors, in VLSI applications having minimum lateral dimensions in the micron to submicron range.

20 Claims, 15 Drawing Figures

SELF-ALIGNED TRANSISTOR METHOD

BACKGROUND OF THE INVENTION

1. Field of the Invention

This invention relates, in general, to methods for fabricating semiconductor devices and, more particularly, to an improved method for self-aligned fabrication of semiconductor devices.

2. Background Art

The packing density, complexity and size of semiconductor devices and integrated circuits depends greatly upon the minimum size devices which may be achieved during fabrication. The smaller the individual semiconductor devices that can be fabricated, the larger the number of devices that can be accommodated within a given semiconductor area, and the greater circuit complexity that can be achieved. Further, smaller devices consume less power and generally also provide greater speed. Thus, there is an ongoing desire in the semiconductor device and integrated circuit art to fabricate ever smaller semiconductor devices, particularly transistors.

Most transistors, and particularly those contained within integrated circuits, are fabricated using lithographic techniques. The area occupied by a particular transistor depends, among other things, upon the minimum size opening which may be replicated in the structure and the alignment tolerance which must be provided to permit registration of successively applied lithographic patterns. For most transistor structures in integrated circuits and the like, a number of successive masking layers must be applied. The cumulative alignment tolerance associated with the successive layers adds substantially to the area occupied by the transistor, even though the transistor utilizes openings of minimum resolvable width. Accordingly, there is an ongoing need in the semiconductor device and integrated circuit art for improved manufacturing methods which minimize the alignment tolerance requirements of the manufacturing process. Thus, it is an object of the present invention to provide an improved manufacturing method for semiconductor devices and integrated circuits having reduced alignment tolerance requirements.

It is a further object of the present invention to provide an improved method for fabricating semiconductor devices and integrated circuits, wherein certain critical device regions are self-aligned It is an additional object of the present invention to provide an improved method for fabricating multiterminal semiconductor devices and integrated circuits wherein at least one active device region, at least three device terminals, and an isolation wall surrounding the device are self-aligned.

It is a still further objective of the present invention to provide an improved method for fabricating bipolar transistors and integrated circuits wherein the emitter, and emitter contact, base contact and collector contact, and a surrounding isolation wall are self-aligned.

It is a still additional object of the present invention to provide an improved method for fabricating semiconductor devices and integrated circuits wherein self-alignment of certain critical device regions is provided by a single master mask.

It is a still further object of the present invention to provide a means for fabricating semiconductor devices and integrated circuits using a single master mask for defining critical device regions which is especially suitable for devices having lateral geometries in the micron to submicron range.

As used herein, the words "master mask" are used to refer to a single mask, however provided, which contains the images of device regions whose lateral alignment and spacing must be fixed with precision.

As used herein the words "block-out mask" or "selector mask" are intended to refer to a mask used during the process of manufacture of a semiconductor device or integrated circuit in conjunction with the master mask. The purpose of the block-out or selector mask is to cover certain openings of the master mask while exposing others. It is not a high precision mask in that it need not have dimensions which exactly match or exactly register with images in the master mask, and need not be precisely aligned to the images in the master mask. The openings in the master mask are used to size and locate critical device regions, whereas the open and covered portions of the block-out or selector masks are used merely to uncover or cover particular openings in the master mask. Those of skill in the art will understand how such block-out and/or selector masks are used.

SUMMARY OF THE INVENTION

The attainment of the foregoing and other objects and advantages is achieved through the present invention wherein there is provided a process for forming a semiconductor device having self-aligned device contacts and isolation comprising, providing a semiconductor substrate, forming a first dielectric on the substrate and a second dielectric on the first dielectric wherein the first and second dielectrics are differentially etchable and the second dielectric is of a material substantially impervious to oxygen, forming a master mask pattern having first, second, and third openings for defining device contacts and a fourth opening for defining an isolation region, wherein the first through fourth openings penetrate through the first and second dielectrics to the substrate and wherein the fourth opening laterally surrounds the first through third openings and wherein edges of the first dielectric are exposed on sidewalls of the first through fourth openings, forming a third dielectric on the sidewalls of the first through fourth openings covering the exposed edges of the first dielectric exposed therein, filling the first through third openings with a fourth dielectric different from the third dielectric, anisotropically etching the substrate beneath the fourth opening to form a trench in the substrate, providing a fifth dielectric covering at least the sidewalls of the trench in the substrate, filling the trench with a semiconductor or insulator material, providing a block-out mask having a fifth opening overlying at least a first region of the substrate including the first and second openings, implanting a first dopant into the first region of the substrate, providing another block-out mask having sixth openings overlying at least a second region of the substrate including at least the first and third openings but not the second opening, and doping a portion of the second region of the substrate beneath the first and third openings with a dopant of a second conductivity type opposite the first conductivity type.

It is desirable that the first and second dielectrics be differentially etchable with respect to each other and the substrate and that the second dielectric be substantially impervious to oxygen. It is desirable that the third dielectric be differentially etchable with respect to the first dielectric and the substrate and also be substantially impervious to oxygen. It is desirable that the fourth dielectric be differentially etchable with respect to the second dielectric and the substrate.

The third dielectric is desirably formed by conformally coating the first and second dielectrics and the sides and bottoms of the openings therein and then anisotropically etching to leave the third dielectric only on the sidewalls of the openings. The step of filling the first through the third openings with the fourth dielectric is desirably performed by depositing a layer of a fourth dielectric over the entire structure, covering this layer with a planarization layer, then etching the combination of the planarization and fourth dielectric layer substantially uniformly to remove the fourth dielectric from the surface except in the first through fourth openings and then using another selector or blockout mask having an opening only including the fourth opening and then selectively etching the portion of the fourth dielectric layer in the fourth opening to expose the substrate therebeneath.

The step of filling the trench with polycrystalline semiconductor material is desirably performed by depositing the polycrystalline semiconductor material substantially over everything, covering it with a planarization layer, and then etching the combination of the planarization layer and the polycrystalline layer to remove the polycrystalline layer everywhere except within the trenches to a point approximately level with the surface of the original substrate.

It is further desirable, prior to the step of doping the second region of the substrate, to cover the polycrystalline silicon in the trenches with a further dielectric region. This is conveniently accomplished by covering the structure with a conformal dielectric and a planarization layer and then etching back to leave the desired thickness of dielectric in the first through fourth openings.

Alignment of the block-out or selector masks to the master mask is not critical. The openings in the block-out or selector masks need only include the openings in the master mask which are desired and need not be perfectly registered thereto. Thus, the structure is fabricated without any critical alignment requirements. The size and location of the critical device regions are determined by the openings in the master mask.

In a bipolar transistor, the first opening conveniently functions to localize the emitter and emitter contact, the second opening conveniently functions to localize the base contact, the third opening conveniently functions to localize the collector contact, and the fourth opening conveniently functions to localize the isolation wall. Since the fifth dielectric covering the sidewalls of the trench need not be thick, there is little lateral encroachment of the isolation trench into the active device area. This is a further advantage of the present method, since it also eliminates the additional tolerance which has customarily been provided in the prior art to accommodate lateral encroachment of isolation walls, particularly where "birds-beak" formation is severe, as is the case with oxide-filled trenches. The use of a thin oxide trench liner combined with a polysilicon trench refill, eliminates this problem. The combination of a single master mask providing a fully self-aligned isolation wall location, emitter and emitter contact location, base contact and collector contact locations, and without any alignment tolerance requirement therebetween, permits a very compact structure to be achieved. This is a particular feature of the present invention.

DETAILED DESCRIPTION OF THE DRAWINGS

For purposes of explanation, the method illustrated herein is shown as used for the fabrication of a vertical bipolar transistor consisting of a particular combination of N and P layers. However, those of skill in the art will understand that this particular transistor and/or combination of N and P layers and the particular device structures used are presented merely as an aid to understanding and are not intended to be limiting, and that other combinations of N and P layers or regions and other types of devices can equally well be fabricated according to the teachings of the present invention.

Figure 14:
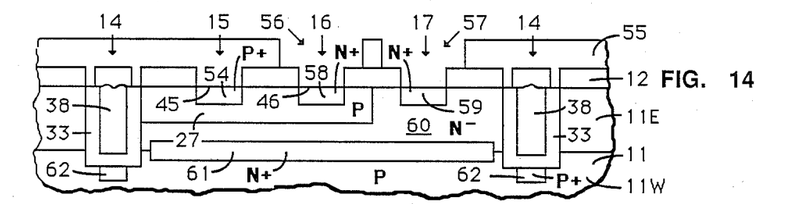
Figure 15:
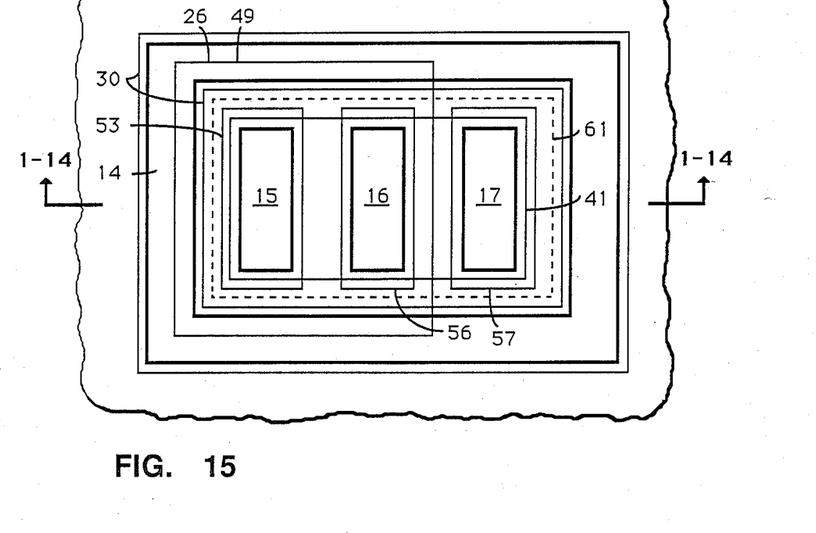
FIG. 15 shows a simplified top view of the device of FIGS. 1–14 showing the superposition of masks and device regions

FIGS. 1–14 show simplified cross-sectional schematic views of portion 10 of a semiconductor device or integrated circuit, according to the present invention, at various stages of manufacture. FIG. 15 is a top view showing how the various mask openings superimpose.

Figure 1:
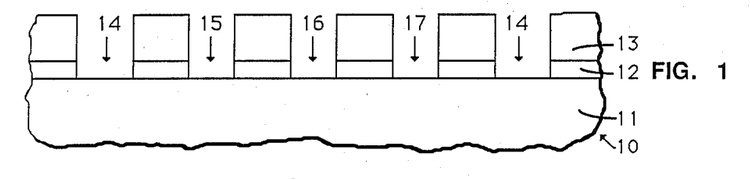
FIGS. 1–14 show simplified schematic cross-sectional views of a portion of a semiconductor device, according to the present invention, during different stages of fabrication.

Device portion 10 comprises semiconductor substrate 11 of, for example, single crystal silicon, on which has been provided first dielectric layer 12 and second dielectric layer 13. Dielectrics 12 and 13 should be differentially etchable with respect to each other and with respect to substrate 11. Further, dielectric 13 should be substantially impervious to oxygen diffusion. Silicon dioxide is an example of a material suitable for layer 12 and silicon nitride is an example of a material suitable for layer 13. However, other materials having the above-described characteristics may also be used.

Using conventional lithographic techniques, openings 14–17 are provided in layers 12–13. The heavy lines in FIG. 15 illustrate how openings 14–17 are arranged with respect to each other when device portion 10 is viewed from the top. Opening 14 has an annular shape so that it laterally encompasses or encloses openings 15–17.

Openings 14–17 are created using a single mask image (not shown). This mask or mask image is referred to herein as the "master mask" since it defines critical lateral device dimensions. Conventional photolithography is a suitable means for creating openings 14–17, although other methods such as E-beam lithography or x-ray lithography may also be used. For very high frequency or very high speed devices and for VLSI circuits, typical minimum lateral dimensions for openings 14–17 are of the order of 0.5–2.0 micrometers, with about 1.0 micrometers being typical. However, larger or smaller openings may also be used, consistent with the resolution capabilities of the available lithographic techniques.

As will become apparent, the method of the present invention is particularly well adapted to scaling to smaller minimum openings sizes. Where openings 14–17 are in the range 0.5–2.0 micrometers wide, layer 12 conveniently has a thickness in the range of about 0.05–0.3 micrometers with about 0.1 micrometer being typical, and layer 13 conveniently has a thickness in the range of about 0.5–2.0 micrometers with about 1.0 micrometer being typical Chemical vapor deposition (CVD), low pressure chemical vapor deposition (LPCVD) and/or plasma enhanced chemical vapor deposition (PECVD) are suitable techniques well known in the art for forming layers 12 and 13. However, other techniques may also be used. For example, thermal oxidation is a particularly convenient method for forming layer 12. Alternatively, layers 12 and/or 13 may be provided by evaporation or sputtering. Such techniques are all well known in the art.

Figure 2:
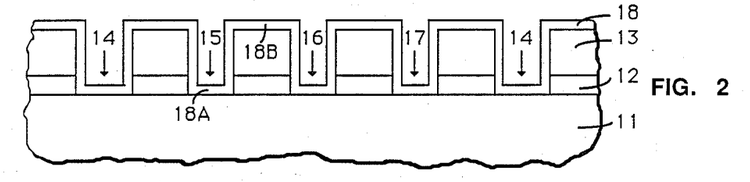

The structure of FIG. 1 is then conformally covered by dielectric layer 18 as shown in FIG. 2. The material of layer 18 should be differentially etchable with respect to substrate 11 and layer 12. Silicon nitride is an example of a suitable material for layer 18. Layer 18 conveniently has a thickness in the range 0.05–0.2 micrometers with about 0.1 micrometer being typical.

Figure 3:
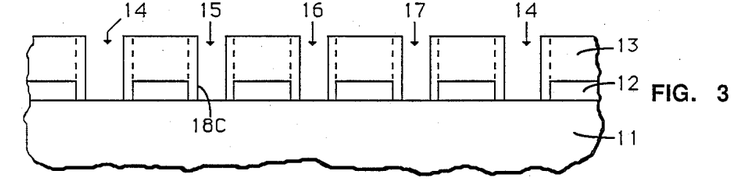

The structure of FIG. 2 is then subjected to anisotropic etching so as to remove portions 18A, 18B of layer 18 at the bottom of openings 14–17 and on top of layer 13 between openings 14–17 so as to leave in place sidewall portions 18C of layer 18 as shown in FIG. 3. This may be conveniently accomplished by reactive ion etching (RIE), a technique which is well known in the art. A type AME 8110 RIE reactor manufactured by Applied Materials, Inc., of Santa Clara, Calif. is suitable. However, other equipment and other anisotropic etching techniques may also be used.

It is convenient in performing the anisotropic etching of layer 18 to use an etching technique which preferentially etches the material of layer 18 so as to not substantially etch the portions of substrate 11 exposed in the bottom of openings 14–17 as portions 18A of layer 18 are removed. Under these circumstances, the etching process is not particularly time critical since over etching merely results in some slight thinning of layer 13 and does not significantly affect the exposed portions of substrate 11. RIE gas mixtures which preferentially attack silicon nitride, for example, are well known in the art.

Figure 4:
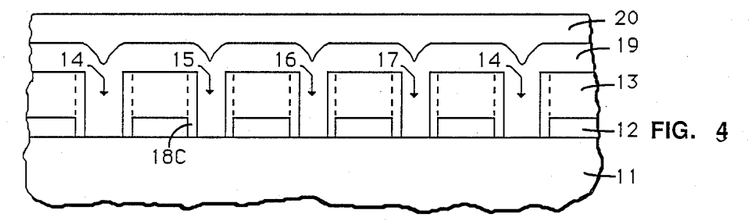

Following the formation of sidewalls spacers 18C in openings 14–17 in FIG. 3, fourth dielectric layer 19 is deposited on the structure, as shown in FIG. 4. It is desirable that fourth dielectric layer 19 have a thickness which is at least equal to one-half the lateral width of the widest opening. This ensures that sufficient dielectric material will be provided in layer 19 to fill openings 14–17 to a level approximately equal to the upper surface of layer 13. It is important that layer 19 be of a material which is differentially etchable with respect to substrate 11 and layers 13 and 18, and that it be able to locally protect substrate 11 against the introduction of dopants. Silicon dioxide is an example of a suitable material. However, other dielectric materials having the above-described combination of properties may also be used. Layer 19 is conveniently formed by CVD, LPCVD, PECVD or other growth or deposition techniques well known in the art.

Layer 19 is then covered by planarizing layer 20. The material of planarizing layer 20 is chosen so as to have an etch rate during subsequent etching which is substantially equal to the etch rate of the material of layer 19, and so that when applied its upper surface is substantially smooth despite undulations or irregularities in the upper surface of underlying layer 19. Photoresist is an example of a suitable planarizing material. It has been found that photoresist having a thickness in the range of about 0.5–2.0 micrometers, with approximately 1.0 micrometer being typical, is suitable for planarizing layer 20.

Figure 5:
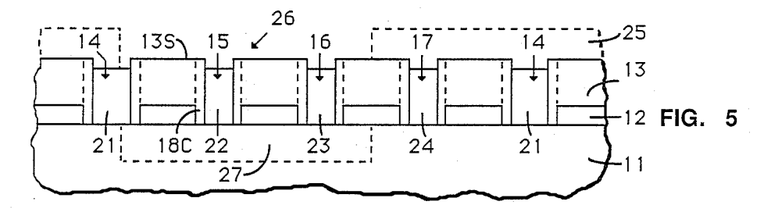

The structure shown in FIG. 4 is then subjected to a planarizing etch so as to remove layer 20 and the excess portions of layer 19 extending above upper surface 13S of layer 13, as shown in FIG. 5. In order to accomplish the planarizing action, it is important that the etch chemistry be such that layers 19 and 20 etch at substantially the same rate, that is, having an etch rate ratio which is about in the range 0.5 to 2.0, preferably in the range 0.9 to 1.1. Etch chemistries having larger or smaller etch rate ratios may also be used, but it becomes more difficult to achieve planarization as the etch rate ratios depart more and more from unity. Adequate planarization can be achieved with etch rate ratios as small as about 0.5 and as large as about 2.0, however thicker layers may be required in these instances. With even larger departure from unity etch rate ratio, it becomes increasingly difficult in a practical way to achieve adequate planarization.

The planarizing etch may be conveniently carried out by reactive ion etching in the same type AME8110 reactor but with an appropriate etch gas. It is desirable that an etch gas or etch chemistry be chosen which does not substantially attack the material of layer 13 or sidewall 18C. Etch techniques for planarizing photoresist-oxide sandwiches preferentially to silicon nitride are well known in the art. The structure may be slightly over etched, that is, etched beyond the point of merely removing the portions of layers 19–20 above upper surface 13S of layer 13, as is indicated in FIG. 5. However, it is important that dielectric plugs 21–24 formed from dielectric 19 and remaining in openings 14–17 have sufficient thickness so as to later be suitable for use as etching, oxidation and dopant masks during the formation of the isolation walls underneath openings 14, as will be subsequently explained.

Where the device being constructed by the process of the present invention is, for example, a vertical bipolar transistor, it is sometimes desirable to form the base region at this point in the process. This option is also illustrated in FIG. 5 where additional mask layer 25 having opening 26 is provided. Base region 27 is conveniently formed by ion implantation of one or more dopants through the portions of layers 12, 13, 18C, and part of plug 21 and all of plugs 22–23 exposed in opening 26. Mask 25 conveniently blocks ion implantation into other portions of substrate 11. Photoresist is a convenient material for mask 25. Thicknesses of mask 25 in the range 0.7–3.0 micrometers are suitable, with about 1.0–1.5 micrometers being typical. Means for providing such ion implantation of dopants are well known in the art.

Mask 25 functions as a selector or block-out mask to determine the region of substrate 11 in which base 27 will be located. The size and location of opening 26 is not especially critical It only needed compass, in this example, openings 15 and 16 and not encompass opening 17. It may lap over opening 14 without harm. Precision alignment to master mask openings 14–17 is not required. Implantation of region 27 may be performed at any time during the process after the step illustrated in FIG. 4 and before the step illustrated in FIG. 14. For convenience of description, it is assumed that region 27 is placed in substrate 11 at a later stage in the process.

Those of skill in the art will understand, that this is merely for simplicity of description and is not intended to be limiting.

Figure 6:
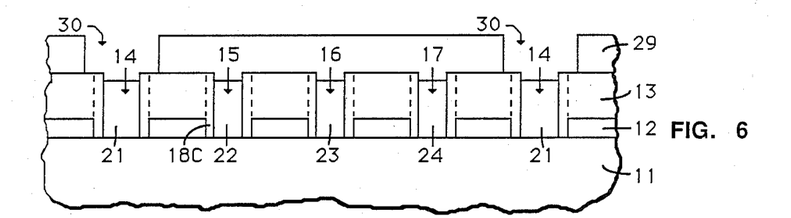

As shown in FIG. 6, block-out mask 29 having opening 30 encompassing opening 14 is applied to the structure of FIG. 5. Block-out mask 29 must be of a material which is resistant to reagents or etch gases suitable for etching dielectric plug 21 in opening 14. Photoresist is a convenient material for block-out mask 29. The thickness of block-out mask 29 is usefully in the range of about 0.5–2.0 micrometers, with about 1.2 micrometer being typical.

Figure 7:
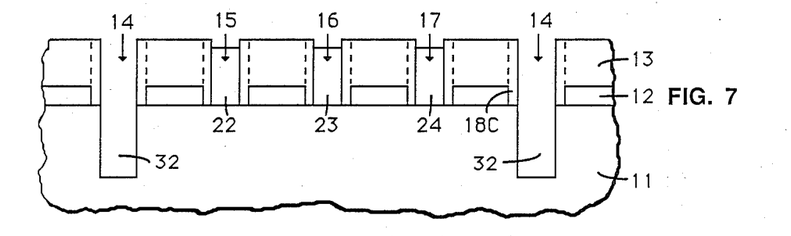

Using block-out mask 29, dielectric plug 21 in opening 14 is removed to expose the underlying portions of substrate 11. Substrate 11 is then etched as shown in FIG. 7 to form trench 32. In the case where a typical vertical bipolar transistor is being fabricated, trench 32 has a depth typically of 3–10 micrometers. Larger or smaller trench depths can be utilized to suit the requirements of the particular device structure.

Anisotropic etching is the preferred method for forming trench 32 in substrate 11. Reactive ion etching in a type AME 8120 reactor produced by Applied Materials, Inc., of Santa Clara, Calif. is suitable. Reactant gases suitable for etching substrate 11 selectively with respect to dielectric layer 13 and sidewall liner 18C as well as oxide plugs 22–24 are known in the art. Halogenated hydrocarbons and/or boron halogen gas mixtures are examples Trench 32 formed under opening 14 laterally encloses openings 15–17 and dielectric plugs 22–24 (see FIG. 15). Trench 32 is used to form the surrounding isolation wall. Where it is desired to provide a channel-stop underneath trench 32, this is conveniently accomplished by ion implanting a dopant in the bottom of trench 32, conveniently at the stage of manufacture illustrated in either FIGS. 7 or 8. Channel-stop 62 is illustrated in FIG. 14 but omitted here for simplicity.

Figure 8:
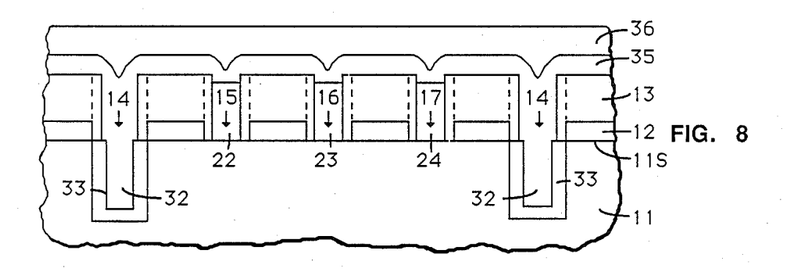

The structure of FIG. 7 (with or without channel-stop 62) is then conveniently oxidized to provide sidewall dielectric 33 in trench 32 in substrate 11 (see FIG. 8). This is conveniently accomplished by thermal oxidation of substrate 11, although other techniques for forming dielectric sidewalls 33 in trench 32 may also be used. Dielectric 33 may also extend to cover the bottom of trench 32 although this is not essential. Dielectric sidewall liner 33 conveniently has a thickness in the range 0.05–0.2 micrometers, with about 0.1 micrometer being typical. Those of skill in the art will understand that as the width of opening 14 is made narrower, for example as lithographic resolution improves, that the thickness of dielectric layer 33 may be reduced.

As further illustrated in FIG. 8, trench 32 with sidewalls 33 is then filled with semiconductor 35. It is desirable that the thickness of semiconductor 35 be at least equal to half the lateral width of the widest feature being filled with semiconductor. For the example shown in FIG. 8, that would be half the width of trench 32 less twice the thickness of sidewall liner dielectric 33. This ensures that sufficient material is deposited to fill trench 33 at least to the level of surface IIS of substrate 11. It is more convenient, however, to somewhat over fill trench 32, as shown in FIG. 8. Semiconductor 35 may be single crystal or polycrystalline. Alternatively, a dielectric may be used in place of semiconductor 35, however this is less convenient.

Polycrystalline silicon is an example of a suitable material for semiconductor layer 35. CVD or LPCVD are examples of convenient techniques for depositing semiconductor 35 or a dielectric trench filler. Other techniques may also be used. Techniques for depositing single or polycrystalline semiconductor materials or dielectrics are well known in the art.

In referring to poly plug 38 filling trench 32, it is intended to include the alternatives of single crystal semiconductor or dielectric filling. However, material having the same coefficient of expansion as substrate 11 is preferred.

It is not essential that poly plug 38 in trench 32 be electrically insulated from substrate 11, although that is convenient. In fact, poly plug 38 may contact substrate 11 at the bottom of trench 32. This occurs automatically when the bottom portion of dielectric 33 is removed prior to deposition of polycrystalline semiconductor 35.

Material 35 is then covered with planarizing layer 36. Planarizing layer 36 is conveniently a photoresist with, for example, thickness in the range of about 0.5–3.0 micrometers with about 1.0 micrometers being typical. A planarizing etch is then carried out in substantially the same manner as has been previously described in connection with FIGS. 4–5, but with reactant gases appropriate to the composition of layers 35–36 so as to selectively etch layers 35–36 to leave the structure shown in FIG. 9. Semiconductor 35 has been etched away to leave poly plug 38 filling trench 32 to level 38S approximately level with surface IIS of substrate 11. Upper surface 38S of poly plug 38 need not be perfectly smooth and need not be perfectly aligned with surface IIS. It has been found convenient to have upper surface 38S within about plus or minus 0.2 micrometers of upper surface IIS.

Figure 9:
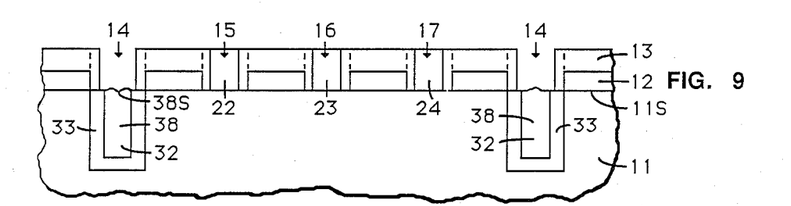

The planarizing etch of layers 35–36 is conveniently carried out in the same type AME 8110 or AME 8120 reactors previously described. It is desirable that the relative etch rates of layers 35–36 be in the range 0.5–2.0, with 0.9–1.1 being preferred.

Figure 10:
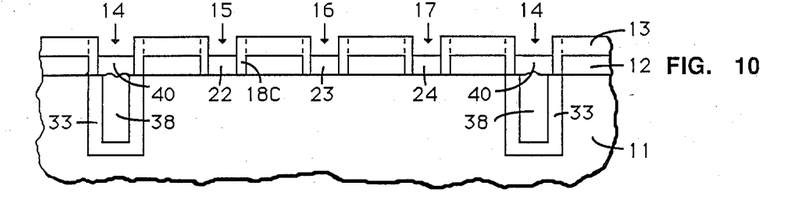

A further dielectric layer and planarizing layer is then conveniently applied to the structure of FIG. 9, in much the same manner as described in connection with the step illustrated in FIGS. 4–5. A planarizing etch is performed in the same way as described in connection with layers 19–20 so as to leave the structure of FIG. 10 in which dielectric 40 has been formed over poly plug 38 in openings 14. FIG. 10 also illustrates the situation in which some over etching occurred during this planarization process so that dielectric plug 40 and dielectric plugs 22–24 as well as the separating portions of dielectric 13 have been somewhat thinned This is not critical. It is only essential that sufficient material of dielectrics 12 and 13 remain outside of openings 14–17 to perform the masking functions to be subsequently described.

Where plug 38 is of semiconductor material, for example silicon, dielectric 40 can alternatively be provided by oxidizing surface 38S of plug 38. This has the advantage of simplicity since the dielectric deposition and planarization steps described immediately above for forming dielectric region 40 are avoided. Since substrate 11 is covered by dielectrics 12, 13, 18C, and 22–24, oxidation of surface 38S does not significantly affect the other portions of the device.

The remaining portions of dielectric layer 13 and sidewall liners 18C may be removed now or at later stages of the process.

Figure 11:
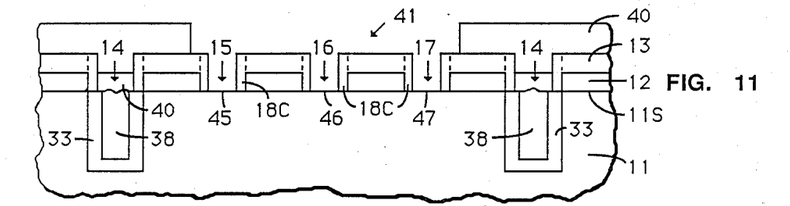

Block-out mask 40 having opening 41 is then applied to the structure of FIG. 10 and dielectric plugs 22–24 removed in openings 15–17 to expose underlying portions 45–47 of substrate 11, as illustrated in FIG. 11.

Block-out mask 40 is conveniently of photoresist with a thickness in the range of about 0.5–1.5 micrometers with about 1.0 micrometers being typical. Like the other block-out masks used, block-out mask 40 and opening 41 need not be precisely aligned to openings 15–17 since its functions is merely to expose openings 15–17 while protecting dielectric plug 40 under opening 14. Selective wet etching is a convenient method for removing oxide plugs 22–24 but other selective etch techniques can also be used.

Figure 12:
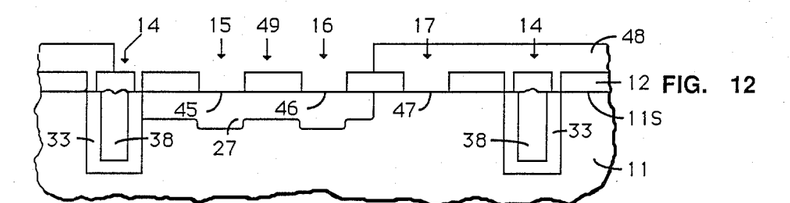
Figure 13:
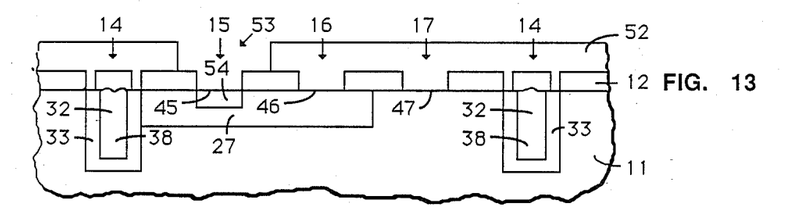

FIG. 12 illustrates the situation after removal of the remaining portions of dielectric 13 and sidewalls 18C. Block-out mask 48, having opening 49, is also applied optionally at this point for the purpose of defining base 27 in the manner previously described in connection with mask 25. Opening 49 in mask 48 encompasses, in this example, master mask openings 15–16, while blocking master mask opening 17. Opening 49 may or may not lap over onto poly plug 38 under opening 14. Region 27 is conveniently formed by ion implantation.

It will be noted in FIG. 12 that the lower surface of region 27 has a varying depth. This reflects the varying penetration of the implanted ions due to the presence of the remaining portions of layer 12 on surface 11S of substrate 11. Where this variation in the lower surface of region 26 is desired to be avoided, it is convenient to form region 27 by implanting at an earlier stage in the process where dielectric plugs still remain in openings 15–16. In a further variation, it is also possible to form region 27 after the implantation of region 54 (see FIG. 13). For simplicity, the variations in the lower surface of region 27 are omitted in subsequent figures. Where a vertical bipolar transistor is being formed, region 27 conveniently acts as the base.

Block-out mask 52, having opening 53, is then conveniently applied (see FIG. 13) to select opening 15 in the master mask while blocking openings 16 and 17. Surface region 45 of substrate 11 is exposed in the combination of openings 15 and 53. Ion implantation is conveniently used to provide doped region 54 below opening 16. The combination of the remaining portions of layer 12 and block-out mask 52 prevent implantation from taking place elsewhere. Photoresist is conveniently used for block-out mask 52. Block-out mask 52 conveniently has a thickness approximately in the range 0.5–1.5 micrometers, with about 1.0 micrometers being convenient. Where region 27 functions as the base of a bipolar transistor, region 54 is conveniently doped so as to form a base contact. Those of skill in the art will appreciate that base contact 54 and base 27 can be implanted in either order.

Block-out mask 52 is then removed and replaced by block-out mask 55 having openings 56–57. Openings 56–57 select, respectively, master mask openings 16, 17 and cover master mask opening 15. Photoresist is a convenient material for block-out mask 55 and is substantially of the same thickness and properties as block-out mask 40. Doped regions 58 and 59 are then conveniently formed by ion implantation through the combination of openings 16, 17 and 56–57. Remaining portions of layer 12 and block-out mask 55 prevent implantation except under master mask openings 16, 17. Where a vertical bipolar transistor is being fabricated, doped region 58 conveniently serves as the emitter and emitter contact, and doped region 59 conveniently serves as the contact to collector region 60. FIG. 14 also illustrates the situation where substrate 11 comprises, for example, P-type wafer portion 11W, N+ buried layer 61 and N-epi layer 11E of which portion 60 provides the collector region of the device under openings 15–17, surrounded by isolation wall 33, 38 fabricated under opening 14.

FIG. 14 also illustrates the situation where P+ channel-stopper 62 has been provided underneath poly plug 38. This is conveniently accomplished by ion implantation in the bottom of trench 32 either before or after formation of dielectric 33 and before trench 14 is filled by poly plug 38. Alternatively, the portion of dielectric 33 in the bottom of trench 32 may be omitted or removed and poly plug 38 doped sufficiently to provide channel-stop 62 by out-diffusion. Based on this description, the detailed techniques for forming channel-stop 62 will be understood by those of skill in the art.

FIG. 15 shows a top view of device portion 10 illustrating the relative placement of openings 14–17, 26, 30, 41, 49, 53, 56, 57, and buried layer 61. For clarity, master mask openings 14–17 are shown as heavy solid lines, and openings, 26, 30, 41, 49, 53, 56, and 57 are shown as light solid lines. Buried layer 61 is shown dashed. Those of skill in the art will understand that the edges of the various block-out mask openings 26, 30, 41, 49, 53, 56, 57 are shown separately for clarity. In actual practice they may be superimposed in certain regions.

While the invented process has been illustrated in terms of particular device structures and device types and combinations of conductivity types, those of skill in the art will recognize that these are merely intended to be illustrative, and that the invented method can be used to form other combinations of conductivity types and other types of devices and structures, as for example, lateral transistors, static induction transistors, field effect transistors, thyristors and triacs, and diodes, to name a few, and further will understand based on the description given herein how these and other devices are formed using the method of the present invention.

Further, various masking, planarization, and etching steps have been described or illustrated as being performed on particular types of equipment or using particular reagent or material combinations. Those of skill in the art will appreciate that other types of equipment and other reagents and materials may also be used, provided they have the requisite properties described herein. Further, while the various dielectric layers and semiconductor materials have been illustrated in terms of silicon and silicon compounds, those of skill in the art will appreciate that other refractory dielectrics and other semiconductor materials may also be used. Accordingly, it is intended to include all such variations within the claims which follow.

We claim:

1. A process for forming a semiconductor device having self-aligned device contacts and isolation, comprising:
   providing a semiconductor substrate;
   forming a first dielectric on said substrate and a second dielectric on said first dielectric, wherein said first and second dielectrics are differentially etchable and said second dielectric is of a material which is substantially impervious to oxygen;
   forming a master mask pattern having at least first, second, and third spaced-apart openings for defining device contacts and a fourth opening for defining an isolation region, wherein said first through fourth openings penetrate through said first and second dielectrics to said substrate, wherein said fourth opening laterally surrounds said first through third openings, and wherein edges of said first dielectric are exposed on sidewalls of said first through fourth openings;

forming a third dielectric on said sidewalls of said first through fourth openings and covering said exposed edges of said first dielectric in said first through fourth openings, wherein said third dielectric is differentially etchable with respect to said first dielectric and substantially impervious to oxygen;

filling said first through third openings with a fourth dielectric different from said second dielectric;

anisotropically etching said substrate beneath said fourth opening to form a trench having exposed sidewalls and bottom in said substrate;

providing a fifth dielectric covering at least said sidewalls of said trench in said substrate;

filling said trench with a polycrystalline semiconductor material;

forming a block-out mask having a fifth opening overlying at least a first region of said substrate including said first and second openings;

implanting said first region of said substrate with a dopant of a first conductivity type;

forming another block-out mask having sixth and seventh openings overlying second and third regions of said substrate, wherein said sixth opening includes said first opening and said seventh opening includes said third opening and neither said sixth or seventh openings includes said second opening; and doping said second and third, regions of said substrate beneath said first and third openings with a dopant of a second conductivity type opposite said first conductivity type.

2. The process of claim 1 further comprising, anytime after said step of filling said trench, the step of forming a further block-out mask having an eighth opening overlying a part of said first region of said substrate and laterally encompassing said second opening but not said first and third opening and then doping said part of said first region through said second opening with a dopant of the same type as introduced into said first region of said substrate.

3. The process of claim 1 wherein said step of forming said third dielectric comprises conformally depositing a layer of said third dielectric and then anisotropically etching said layer of said third dielectric to substantially remove it except on said sidewalls of said first through fourth openings.

4. The process of claim 1 wherein said step of filling said first through third openings with a fourth dielectric comprises depositing a layer of a fourth dielectric over said second dielectric and in said first through fourth openings so as to substantially fill said first through fourth openings, covering said layer of said fourth dielectric with a first planarization layer, etching said first planarization layer and said layer of said fourth dielectric to substantially remove said fourth dielectric except in said first through fourth openings, applying a selector mask covering at least said first through third openings but not said fourth opening, and selectively etching the portion of said fourth dielectric layer in said fourth opening to expose said substrate therebeneath.

5. The process of claim 1 wherein said step of filling said trench comprises depositing a semiconductor material on exposed portions of said second through fifth dielectrics and in said trench sufficient to at least fill said trench, depositing a planarizing layer on said semiconductor material, and then etching said planarizing layer and said semiconductor material at substantially the same rate and selectively with respect to exposed portions of said second through fifth dielectrics until the upper surface of said polycrystalline semiconductor material in said fourth opening is approximately level with said substrate and other portions of said semiconductor material on said second through fourth dielectrics are substantially removed.

6. The process of claim 1 wherein said step of forming said first and second dielectrics further comprises forming first and second dielectrics which are differentially etchable with respect to each other and said substrate.

7. The process of claim 1 wherein said step of forming said third dielectric further comprises forming a third dielectric which is differentially etchable with respect to said substrate.

8. The process of claim 4 wherein said step of filling said first through third openings with a fourth dielectric further comprises filling said first through third openings with a dielectric material which is differentially etchable with respect to said second and third dielectrics and said substrate.

9. The process of claim 1 wherein said steps of forming a block-out mask having a fifth opening and implanting said first region of said substrate take place before said step of anisotropically etching said substrate.

10. The process of claim 1 wherein said steps of forming a block-out mask having a fifth opening and implanting said first region of said substrate take place after said step of forming said third dielectric and before said step of forming said another block-out mask having sixth and seventh openings.

11. The process of claim 1 further comprising after said step of etching said trench in said substrate, doping said substrate beneath said trench.

12. The process of claim 1 further comprising after said step of filling said trench with a semiconductor material, forming a sixth dielectric on said semiconductor material filling said trench.

13. The process of claim 1 further comprising after said step of filling said trench, removing remaining portions of said second and third dielectric.

14. The process of claim 1 further comprising after said step of filling said trench with a semiconductor material, removing remaining portions of said second and third dielectrics and forming a sixth dielectric on said semiconductor material filling said trench.

15. A process for forming a bipolar transistor having an emitter, a base, a collector, and laterally surrounding isolation wall, wherein said isolation wall, emitter and emitter contact, base contact, and collector contact are self-aligned by a single master mask pattern, comprising:

providing a semiconductor substrate having a principal surface;

forming first and second superposed dielectric layers on said principal surface, wherein said first and second dielectric layers are differentially etchable with respect to each other and said substrate;

using said single master mask pattern, forming openings in said first and second dielectric layers penetrating to said substrate and comprising at least a first opening for said emitter and emitter contact, a second opening for said base contact, a third opening for said collector contact, and a fourth opening for said isolation wall;

forming opposed first sidewall liners of a third dielectric in said first through fourth openings, wherein said third dielectric is differentially etchable with respect to said substrate and said first dielectric layer and protects edges of said first layer exposed in said first through fourth openings;

filling the space remaining between said opposed first sidewall liners in said first through fourth openings with a fourth dielectric different than said third dielectric and differentially etchable with respect to said third dielectric and said substrate;

removing said fourth dielectric from said fourth opening and etching the portion of said substrate thereby exposed to form a trench in said substrate beneath said fourth opening;

forming opposed second sidewall liners of a fifth dielectric at least on the sidewalls of said trench;

filling the space remaining between said opposed second sidewall liners in said trench with polycrystalline semiconductor having an upper surface approximately level with said principal surface of said substrate;

forming a sixth dielectric on said upper surface of said polycrystalline semiconductor;

using a block-out mask, selectively removing said fourth dielectric from said first through third openings;

anytime prior to the following steps, implanting said base region laterally encompassing said first and second openings;

using a further block-out mask for selecting said first and third openings, implanting said emitter and emitter contact and said collector contact in said substrate beneath said first and third openings, respectively; and after said step of selectively removing said fourth dielectric from said first through third openings, using a still further block-out mask for selecting said second opening, implanting said base contact in said base region beneath said second opening.

16. The process of claim 15 further comprising, after said step of filling said trench with said polycrystalline semiconductor, removing remaining portions of said second and third dielectric layers.

17. The process of claim 16 wherein said fourth opening comprises, laterally, an annular shape encompassing said first through third openings, and wherein said semiconductor substrate comprises a buried layer having a predetermined lateral extent, and wherein said annular shape also laterally encompasses said buried layer.

18. A process for forming a semiconductor device having first, second, third, and fourth self-aligned regions in a substrate, comprising:

providing said substrate having a principal surface;

forming first and second dielectric layers on said principal surface, wherein said first and second dielectric layers are differentially etchable with respect to each other and said substrate;

using a single mask pattern, etching first, second, third, and fourth openings through said first and second dielectric layers to said substrate, to locate respectively said first, second, third, and fourth regions in said substrate;

providing first dielectric sidewall liners in said first through fourth openings, wherein said first dielectric sidewall liners are differentially etchable with respect to said first dielectric and said substrate;

filling the space remaining in said first through fourth openings with a third dielectric differentially etchable with respect to said first sidewall liners and said substrate;

removing said third dielectric from said fourth opening;

etching said fourth region of said substrate beneath said fourth opening to form a trench in said substrate;

providing second dielectric sidewall liners in said trench;

filling the space remaining between said second sidewall liners in said trench with a polycrystalline semiconductor;

doping a fifth region of said substrate encompassing said first and second regions with a dopant of a first conductivity type, and then in either order and without using a mask having an opening whose edge is laterally within said first, second, or third openings, doping said first and third regions of said substrate with a dopant of a second type opposite said first type through said first and third openings, and doping said second region of said substrate with a dopant of said first type through said second opening.

19. The process of claim 18 wherein said second and third doping steps comprise, respectively, providing a first block-out mask having an opening encompassing said first and third openings but not said second opening and performing said second doping step through said opening in said first block-out mask, and providing a second block-out mask having an opening encompassing said second opening but not said first and third openings and performing said third doping step through said opening in said second block-out mask.

20. The process of claim 18 wherein said first and third dielectric layers and said second sidewall liners are oxide, and wherein said second dielectric layer and said first sidewall liners are nitride.

* * * * *